(12) United States Patent
Mignot et al.

(10) Patent No.: US 10,679,892 B1
(45) Date of Patent: Jun. 9, 2020

(54) MULTI-BURIED ULK FIELD IN BEOL STRUCTURE

(71) Applicant: INTERNATIONAL BUSINESS MACHINES CORPORATION, Armonk, NY (US)

(72) Inventors: Yann Mignot, Slingerlands, NY (US); Chih-Chao Yang, Glenmont, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/288,940

(22) Filed: Feb. 28, 2019

(51) Int. Cl.
*H01L 21/4763* (2006.01)
*H01L 21/768* (2006.01)
*H01L 21/311* (2006.01)

(52) U.S. Cl.
CPC .. *H01L 21/76816* (2013.01); *H01L 21/31116* (2013.01); *H01L 21/76822* (2013.01); *H01L 21/76837* (2013.01)

(58) Field of Classification Search
CPC ........... H01L 23/53295; H01L 23/5329; H01L 21/76832; H01L 21/02063; H01L 21/76843; H01L 21/76877; H01L 21/76883
USPC .................. 438/622, 637; 257/622, 632, 635
See application file for complete search history.

(56) References Cited

U.S. PATENT DOCUMENTS

| | | | |
|---|---|---|---|
| 5,320,975 A | 6/1994 | Cederbaum et al. | |
| 5,362,663 A | 11/1994 | Bronner et al. | |
| 6,927,463 B2 | 8/2005 | Iwata et al. | |
| 6,933,586 B2 | 8/2005 | Fornof et al. | |
| 7,504,340 B1 | 3/2009 | Drizlikh et al. | |
| 7,679,083 B2 | 3/2010 | Sun et al. | |
| 7,994,583 B2 | 8/2011 | Inaba | |
| 8,420,947 B2 * | 4/2013 | Srivastava | H01L 21/0273 174/250 |
| 8,703,604 B2 | 4/2014 | Ponoth et al. | |
| 8,809,196 B2 | 8/2014 | Zin | |
| 8,822,342 B2 | 9/2014 | Srivastava et al. | |
| 8,981,466 B2 | 3/2015 | Grill et al. | |
| 9,530,691 B1 * | 12/2016 | Zhang | H01L 21/76828 |
| 9,984,935 B2 | 5/2018 | Briggs et al. | |
| 10,043,744 B2 | 8/2018 | Chan et al. | |
| 2008/0166847 A1 | 7/2008 | Utomo et al. | |

(Continued)

FOREIGN PATENT DOCUMENTS

CN 102148216 A 8/2011

*Primary Examiner* — S. V. Clark
(74) *Attorney, Agent, or Firm* — Tutunjian & Bitetto, P.C.; Vazken Alexanian (57) ABSTRACT

A method is presented for reducing a resistance-capacitance product and RIE lag in a semiconductor device. The method includes depositing a first ultra-low-k (ULK) material over a dielectric cap, the first ULK material defining a recess, filling the recess with a second ULK material, the second ULK material being different than the first ULK material, where the first and second ULK materials are formed in a common metal level of a back-end-of-the-line (BEOL) structure, forming first trenches within the first ULK material and second trenches within the second ULK material, and filling the first and second trenches with a conductive material.

20 Claims, 7 Drawing Sheets

(56) References Cited

U.S. PATENT DOCUMENTS

| | | | | |
|---|---|---|---|---|
| 2011/0117737 A1* | 5/2011 | Agarwala | ......... | H01L 21/76805 |
| | | | | 438/627 |
| 2012/0146224 A1* | 6/2012 | Bao | ................... | H01L 21/02126 |
| | | | | 257/751 |
| 2015/0228585 A1* | 8/2015 | He | .................... | H01L 23/53238 |
| | | | | 257/751 |

* cited by examiner

MULTI-BURIED ULK FIELD IN BEOL STRUCTURE

BACKGROUND

The present invention relates generally to semiconductor devices, and more specifically, to using two or more dielectrics in a common metal level in back-end-of-the-line (BEOL) structures.

Integrated circuit (IC) chips are formed with BEOL metal levels. Each metal level can include metal wires (e.g., copper wires) that fill trenches with a layer of interlayer dielectric (ILD) material. Usually, at each metal level, the metal wires and adjacent ILD material will be capped with a dielectric capping layer (e.g., a silicon nitride capping layer), which minimizes electromigration (EM) and functions as an etch stop layer during formation of upper metal levels. In any case, these metal wires can function as interconnects, which provide electrical connections to on-chip devices (e.g., through vias and/or other metal wires) and/or to off-chip devices (e.g., through vias, other metal wires and/or input/output pins).

SUMMARY

In accordance with an embodiment, a method is provided for reducing a resistance-capacitance product and RIE LAG in a semiconductor device. The method includes depositing a first ultra-low-k (ULK) material over a dielectric cap, the first ULK material defining a recess, filling the recess with a second ULK or dielectric material, the second ULK or dielectric material being different than the first ULK material, where the first and second ULK materials are formed in a common metal level of a back-end-of-the-line (BE-OL) structure, forming first trenches within the first ULK material and second trenches within the second ULK or dielectric material, and filling the first and second trenches with a conductive material.

In accordance with another embodiment, a method is provided for reducing a resistance-capacitance product and RIE LAG in a semiconductor device. The method includes depositing a first ultra-low-k (ULK) material over a dielectric cap, the first ULK material defining a recess, depositing a dielectric liner over the first ULK material, filling the recess including the dielectric liner with a second ULK or dielectric material, the second ULK material being different than the first ULK material, where the first and second ULK materials are formed in a common metal level of a back-end-of-the-line (BEOL) structure, forming first trenches within the first ULK material and second trenches within the second ULK material, and filling the first and second trenches with a conductive material.

In accordance with yet another embodiment, a semiconductor device is provided for reducing a resistance-capacitance product and RIE LAG. The semiconductor device includes a back-end-of-the-line (BEOL) structure including a plurality of metal levels, a first ultra-low-k (ULK) material disposed over a dielectric cap, a second ULK material positioned within a recess of the first ULK material, the second ULK material being different than the first ULK material, where the first and second ULK materials are disposed in a common metal level of the BEOL structure, first trenches patterned within the first ULK material, second trenches patterned within the second ULK material, and a conductive material disposed within the first and second trenches.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing two or more dielectrics in a common metal level in back-end-of-the-line (BEOL) structures. With the 7 nm technology node in the development phase and the 5 nm node moving into development, transistor scaling gets ever more complex. On top of that, the performance benefits gained at the front-end-of-line (i.e., the transistors) can easily be undone if the back-end-of-line (BEOL) can't come along. BEOL processing involves the creation of stacked layers of, e.g., copper (Cu) wires. The wires can also be aluminum (Al), tungsten (W), ruthenium (Ru), etc. The wires electrically interconnect the transistors in the chip. Today, high-end logic chips easily have 12 to 15 levels of Cu wires. With each technology node, this Cu wiring scheme becomes more complex, mainly because there are more transistors to connect with an ever tighter pitch. Shrinking dimensions also means the wires have a reduced cross-sectional area, which drives up the resistance-capacitance (RC) product of the interconnect system. This results in a strongly increasing signal delay. Embodiments in accordance with the present invention provide methods and devices for employing two or more dielectrics in a common metal level to reduce the RC product and to improve reactive ion etch (RIE) lag.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
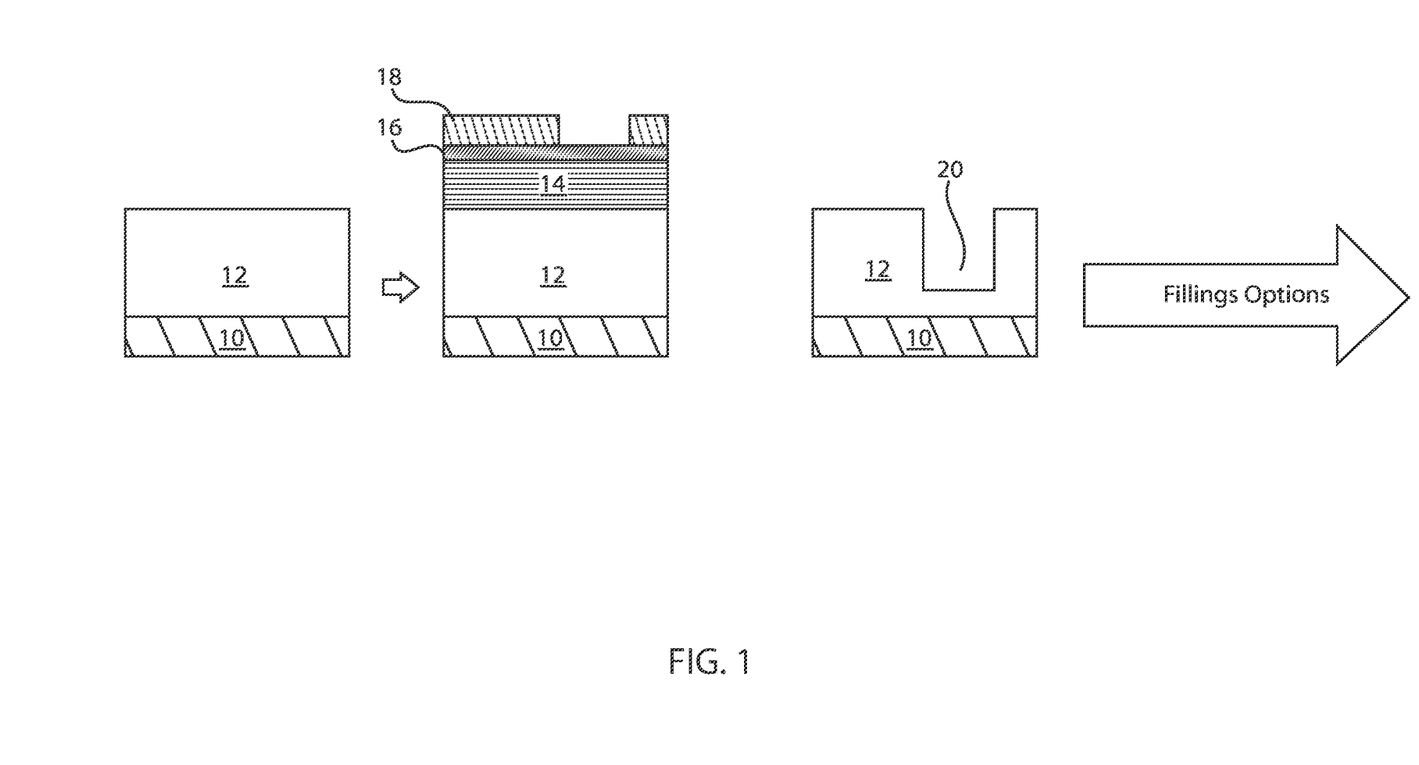
FIG. 1 is a cross-sectional view of a semiconductor structure including an organic planarization layer (OPL), an anti-reflective coating (ARC) layer, and a photoresist deposited over a first dielectric material, to subsequently form a recess or opening within the first dielectric material, in accordance with an embodiment of the present invention.

FIG. 1 is a cross-sectional view of a semiconductor structure including an organic planarization layer (OPL), an anti-reflective coating (ARC) layer, and a photoresist deposited over a first dielectric material, to subsequently form a recess or opening within the first dielectric material, in accordance with an embodiment of the present invention.

A semiconductor structure includes a first ultra-low-k dielectric (ULK) material 12 formed over a dielectric cap 10. The OPL 14 can then be formed over the first ULK material 12. Additionally, the ARC layer 16 and the photoresist layer 18 can be formed over the OPL 14. After forming the OPL 14, the ARC layer 16, and the photoresist layer 18, the photoresist 18 is exposed using optical or EUV lithography technics, and etching and stripping take place to form a recess or opening 20 in the first ULK material 12.

The first ULK material 12 can include any materials known in the art, such as, for example, porous silicates, carbon doped oxides, silicon dioxides, silicon nitrides, silicon oxynitrides, or other dielectric materials. The first ULK material 12 can be formed using any method known in the art, such as, for example, chemical vapor deposition, plasma enhanced chemical vapor deposition, atomic layer deposition, or physical vapor deposition. The first ULK material 12 can have a thickness ranging from about 25 nm to about 200 nm.

The first ULK material 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The dielectric cap 10 can be referred to as a barrier layer. The dielectric material of the dielectric cap 10 can be, e.g., silicon nitride (SiN).

The OPL 14 and the ARC layer 16 can be employed as a lithographic stack to pattern the underlying layers. The OPL 14 can be formed at a predetermined thickness to provide reflectivity and topography control during etching of the hard mask layers below. The OPL 14 can include an organic material, such as a polymer. The thickness of the OPL 14 can be in a range from about 50 nm to about 300 nm.

The layer 16 is an ARC layer which minimizes the light reflection during lithography for a lithography stack. The ARC layer 16 can include silicon, for example, a silicon anti-reflective layer (SiARC). The thickness of the ARC layer 16 can be in range from about 10 nm to about 100 nm. The ARC layer 16 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 18 (e.g., a material that will react when exposed to light), and then selectively exposing portions of the photoresist 18 to light or other ionizing radiation (e.g., ultraviolet, electron beams, X-rays, etc.), thereby changing the solubility of portions of the material. The photoresist 18 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 2:
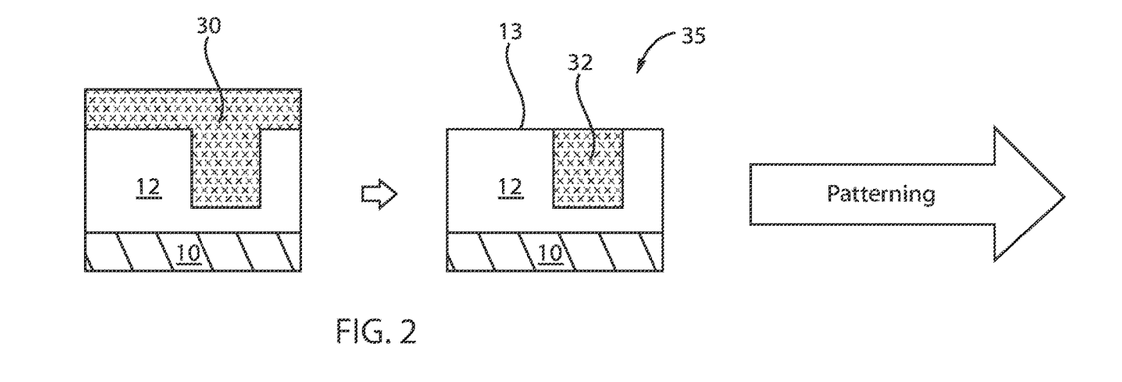
FIG. 2 is a cross-sectional view of the semiconductor structure of FIG. 1 where the recess or opening is filled with a second dielectric material and CMP is performed, in accordance with an embodiment of the present invention.

FIG. 2 is a cross-sectional view of the semiconductor structure of FIG. 1 where the recess or opening is filled with a second dielectric material and CMP is performed, in accordance with an embodiment of the present invention.

In various exemplary embodiments, a second ULK material 30 is deposited over the first ULK material 12. The height of the second ULK material 30 can be reduced by chemical-mechanical polishing (CMP) and/or etching to expose a top surface 13 of the first ULK material 12. Therefore, the planarization process can be provided by CMP. Other planarization process can include grinding and polishing. The remaining ULK material is designated as 32. The second ULK material 30 can be formed using any method known in the art, such as, for example, chemical vapor deposition, plasma enhanced chemical vapor deposition, atomic layer deposition, or physical vapor deposition.

Figure 4:
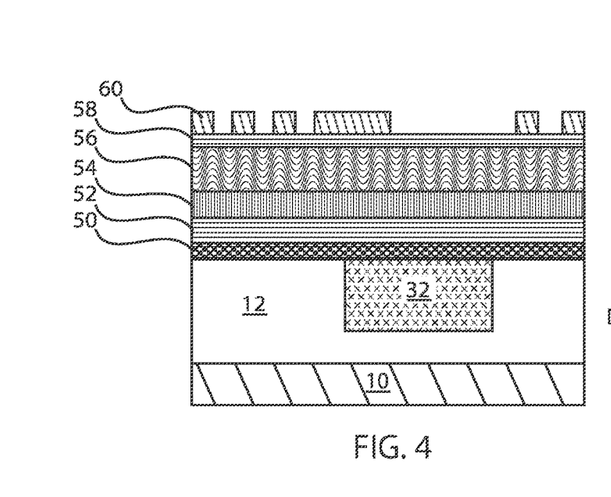
FIG. 4 is a cross-sectional view of the semiconductor structure of FIG. 3 where lithography trench patterning takes place, in accordance with an embodiment of the present invention.
Figure 5:
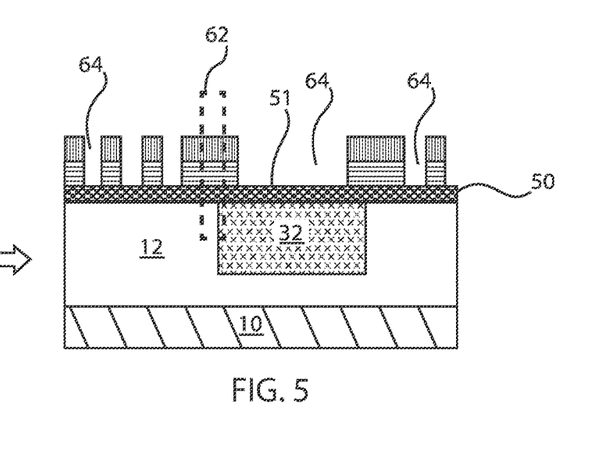
FIG. 5 is a cross-sectional view of the semiconductor structure of FIG. 4 where the OPL, the ARC layer, and the photoresist are etched such that a sacrificial layer over the second dielectric material remains intact, in accordance with an embodiment of the present invention.
Figure 6:
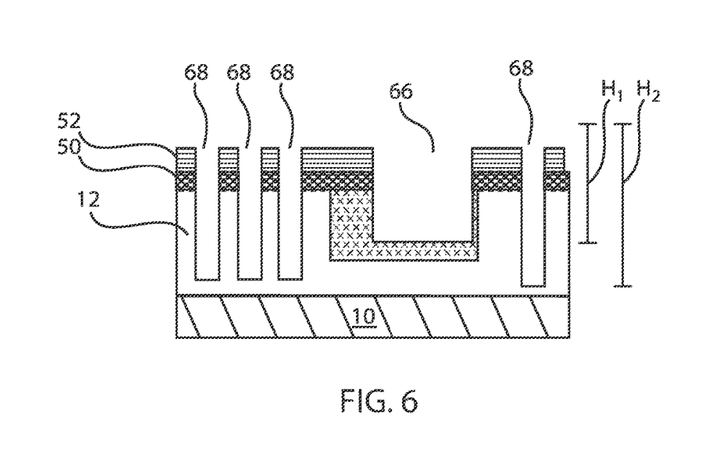
FIG. 6 is a cross-sectional view of the semiconductor structure of FIG. 5 where the first and second ULK materials are etched to form trenches therein, in accordance with an embodiment of the present invention.

Thus, the structure 35 includes a second ULK material 32 embedded or incorporated or positioned within the first ULK material 12. Patterning can then take place, as shown in FIGS. 4-6 described below.

Figure 3:
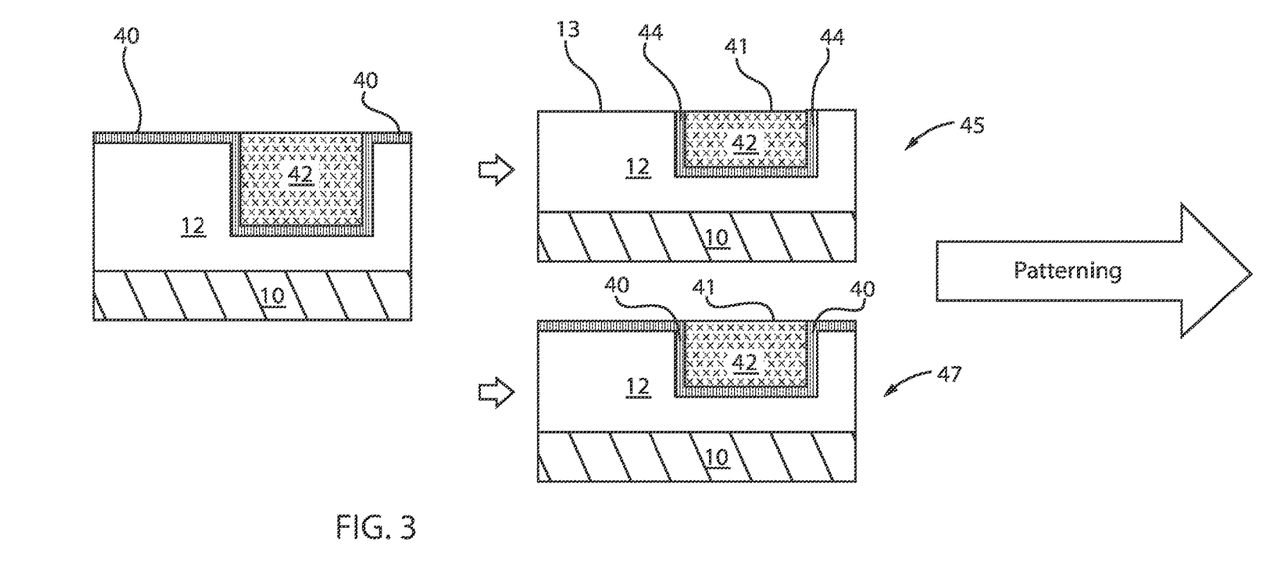
FIG. 3 is a cross-sectional view of the semiconductor structure of FIG. 1 where a dielectric liner is deposited within the recess or opening before depositing the second dielectric material and CMP is performed, in accordance with another embodiment of the present invention.

FIG. 3 is a cross-sectional view of the semiconductor structure of FIG. 1 where a dielectric liner is deposited within the recess or opening before depositing the second dielectric material and CMP is performed, in accordance with another embodiment of the present invention.

In various exemplary embodiments, a dielectric liner 40 can be deposited over the first ULK material 12 before depositing a second ULK material 42.

The dielectric liner 40 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H.

In some embodiments, the dielectric liner 40 includes multiple materials. The dielectric liner 40 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

The dielectric liner 40 can be planarized by, e.g., CMP, such that top surface 13 of the first ULK material 12 is exposed, as well as a top surface 41 of dielectric 42. Thus, structure 45 depicts remaining dielectric liner 44 after CMP, whereas structure 47 depicts the entire or partial dielectric liner 40 after CMP. Thus, the CMP can stop either at the top surface 13 of the first ULK material 12 or the CMP can stop at the dielectric liner 40. Patterning can then take place, as shown in FIGS. 4-6 described below.

FIG. 4 is a cross-sectional view of the semiconductor structure of FIG. 3 where lithography trench patterning takes place, in accordance with an embodiment of the present invention.

In various exemplary embodiments, a sacrificial layer 50 is deposited over the first and second ULK materials 12, 32. Then, a titanium nitride (TiN) layer 52, a tetraethylorthosilicate (TEOS) layer 54, an OPL 56, an ARC layer 58, and a photoresist layer 60 are deposited.

FIG. 5 is a cross-sectional view of the semiconductor structure of FIG. 4 where the OPL, the ARC layer, and the photoresist are etched such that a sacrificial layer over the second dielectric material remains intact, in accordance with an embodiment of the present invention.

In various exemplary embodiments, the OPL 56, the ARC layer 58, and the photoresist layer 60 are etched to form a hardmask portion over the sacrificial layer 50. The etching can be, e.g., a reactive ion etch (RIE). Additionally, a top surface 51 of the sacrificial layer 50 is exposed. Additionally, trenches 64 are formed over the first ULK material 12 and a trench 64 is formed over the second ULK material 32.

Additionally, the element 62 depicts that the mask position overlaps the second ULK material's transition to avoid unwanted transition.

FIG. 6 is a cross-sectional view of the semiconductor structure of FIG. 5 where the first and second ULK materials are etched to form trenches therein, in accordance with an embodiment of the present invention.

In various exemplary embodiments, the first and second ULK materials 12, 32 are etched resulting in trench 66 formed in the second ULK material 32 and trenches 68 formed in the first ULK material 12. The height or depth of the trench 66 of the second ULK material 32 is designated as $H_1$ and the height of the trenches 68 of the first ULK material 12 are designated as $H_2$. In an example embodiment, $H_2 > H_1$. The depth is controlled by time and etch chemistry by using a simultaneous etch sequence for both the first ULK material 12 and the second ULK material 32. The etch selectivity difference or not with the same RIE chemistry between the two different ULK forms or not different trench depth.

It is noted that a similar configuration or scheme can be created where the dielectric liner 40 is present adjacent the second ULK material 42.

Figure 7:
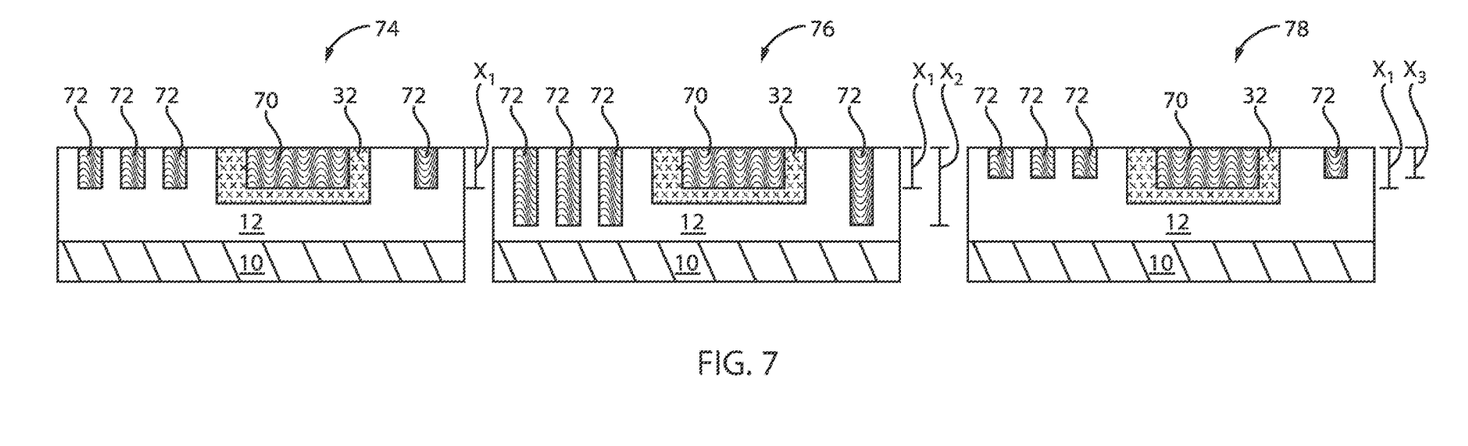
FIG. 7 is a cross-sectional view of the semiconductor structure of FIG. 6 where metallization and chemical-mechanical polishing (CMP) are performed, where the recess or opening does not include a dielectric liner, in accordance with an embodiment of the present invention.

FIG. 7 is a cross-sectional view of the semiconductor structure of FIG. 6 where metallization and chemical-mechanical polishing (CMP) are performed, where the recess or opening does not include a dielectric liner, in accordance with an embodiment of the present invention.

In various example embodiments, a conductive material 70, 72 can be deposited within the trenches 66, 68. The metallization can be a single damascene metallization. Thus, only single damascene metallization is needed for the trench, thus enabling dynamic reflow or other fill techniques that are sensitive to pattern and profile needs. The conductive material 70, 72 can be metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. Based on the metallization, a liner is needed to prevent metallic diffusion in the dielectric.

In various exemplary embodiments, the height of the conductive material 70, 72 can be reduced by chemical-mechanical polishing (CMP) and/or etching. Therefore, the planarization process can be provided by CMP. Other planarization process can include grinding and polishing.

In FIG. 7, structure 74 depicts trenches 68 formed within the first ULK material 12 having a same height as trench 66 formed within the second ULK material 32. Thus, the trenches 66, 68 can be formed to have a substantially same height or depth. The height or depth can be designated as $X_1$.

In FIG. 7, structure 76 depicts trenches 68 formed within the first ULK material 12 having a different height than trench 66 formed within the second ULK material 32. Thus, the trenches 66, 68 can be formed to have a different height or depth. The height or depth of the trench 66 can be designated as $X_1$, whereas the height or depth of the trenches 68 can be designated as $X_2$, where $X_2 > X_1$. The etch selectivity for the first and second ULK materials 12, 32 can be precisely controlled by the etch chemistry to control a depth of trenches 66, 68.

In FIG. 7, structure 78 depicts trenches 68 formed within the first ULK material 12 having a different height than trench 66 formed within the second ULK material 32. Thus, the trenches 66, 68 can be formed to have a different height or depth. The height or depth of the trench 66 can be designated as $X_1$, whereas the height or depth of the trenches 68 can be designated as $X_3$, where $X_1 > X_3$. The etch selectivity for the first and second ULK materials 12, 32 can be precisely controlled by the etch chemistry to control a depth of trenches 66, 68.

Thus, different etch selectivity can be employed for each of the first and second ULK materials 12, 32 based on desired user manufacturing specifications. Etch selectivity can be modulated with a different concentration of active species in the etch plasma that will increase or decrease the etch rate of a specific ULK vs. the $2^{nd}$ ULK.

Figure 8:
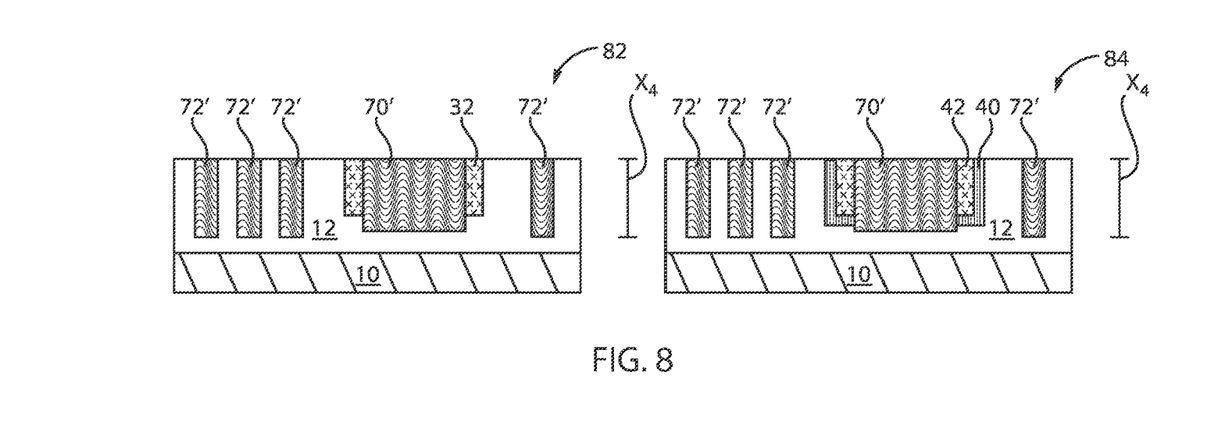
FIG. 8 is a cross-sectional view of the semiconductor structure of FIG. 7 where metallization and chemical-mechanical polishing (CMP) are performed, where the conductive material comes into direct contact with the first ULK material, in accordance with an embodiment of the present invention.

FIG. 8 is a cross-sectional view of the semiconductor structure of FIG. 7 where metallization and chemical-mechanical polishing (CMP) are performed, where the conductive material comes into direct contact with the first ULK material, in accordance with an embodiment of the present invention.

In various example embodiments, a conductive material 70', 72' can be deposited within the trenches 66, 68. The conductive material 70', 72' can be metals include copper (Cu), cobalt (Co), aluminum (Al), platinum (Pt), gold (Au), tungsten (W), titanium (Ti), or any combination thereof. Based on the metallization, a liner is needed to prevent metallic diffusion in the dielectric.

In various exemplary embodiments, the height of the conductive material 70', 72' can be reduced by CMP and/or etching. Therefore, the planarization process can be provided by CMP. Other planarization process can include grinding and polishing.

In FIG. 8, structure 82 depicts trenches 68 formed within the first ULK material 12 having a same height as trench 66 formed within the second ULK material 32. Thus, the trenches 66, 68 can be formed to have a substantially same height or depth. The height or depth can be designated as $X_4$. Moreover, the trench 66 can be formed to penetrate the "bucket" or "wells" formed by the first ULK material 12. In other words, the conductive material 70' comes into direct contact with the first ULK material 12.

In FIG. 8, structure 84 depicts trenches 68 formed within the first ULK material 12 having a same height as trench 66 formed within the second ULK material 42. Thus, the trenches 66, 68 can be formed to have a substantially same height or depth. The height or depth can be designated as $X_4$. Also, in the instant case, the dielectric liner 40 is present around the second ULK material 42. Moreover, the trench 66 can be formed to penetrate the "bucket" or "wells" formed by the first ULK material 12. In other words, the conductive material 70' comes into direct contact with the first ULK material 12.

Figure 9:
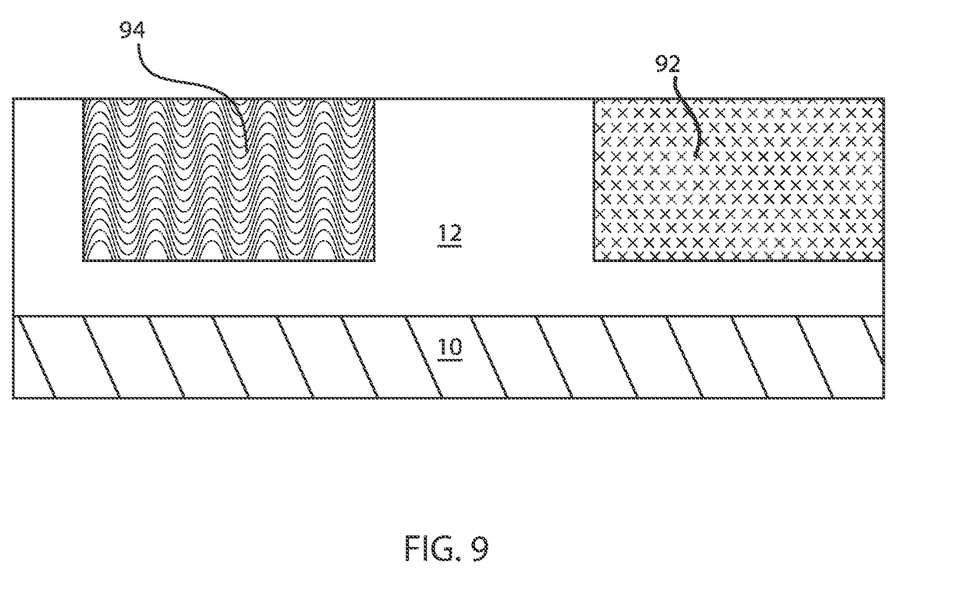
FIG. 9 is a cross-sectional view of a semiconductor structure where more than two dielectric materials are formed in a single back-end-of-the-line (BEOL) metal level, in accordance with another embodiment of the present invention.

FIG. 9 is a cross-sectional view of a semiconductor structure where more than two dielectric materials are formed in a single back-end-of-the-line (BEOL) metal level, in accordance with another embodiment of the present invention.

In various exemplary embodiments, another ULK material can be formed within the first ULK material. In other words, a second ULK material 92 and a third ULK material 94 can be formed within the first ULK material 12. Thus, two different "buckets" or "wells" or trenches can be formed within the first ULK material 12. Each "bucket" can be filled with a different ULK material. One skilled in the art can contemplate a plurality of "buckets" or trenches in the first ULK material 12, where each bucket is filled with a different ULK material.

For example, when two ULK materials are employed, the first ULK material 12 can have a low-k dielectric constant that is less than 2.7 and the second ULK material 32, 42 can have a low-k dielectric constant that is greater than 2.7.

For example, when three ULK materials are employed, the first ULK material 12 can have a low-k dielectric constant that is less than 2.7, the second ULK material 92 can have a low-k dielectric constant that is between 2.7 and 3.0, and the third ULK material 94 can have a low-k dielectric constant that is greater than 3.0.

One skilled in the art can contemplate various different low-k dielectric constants for each of the ULK materials used within the metal level of a BEOL structure. An additional dielectric liner can be added as well based on the electrical requirement of the product.

Figure 10:
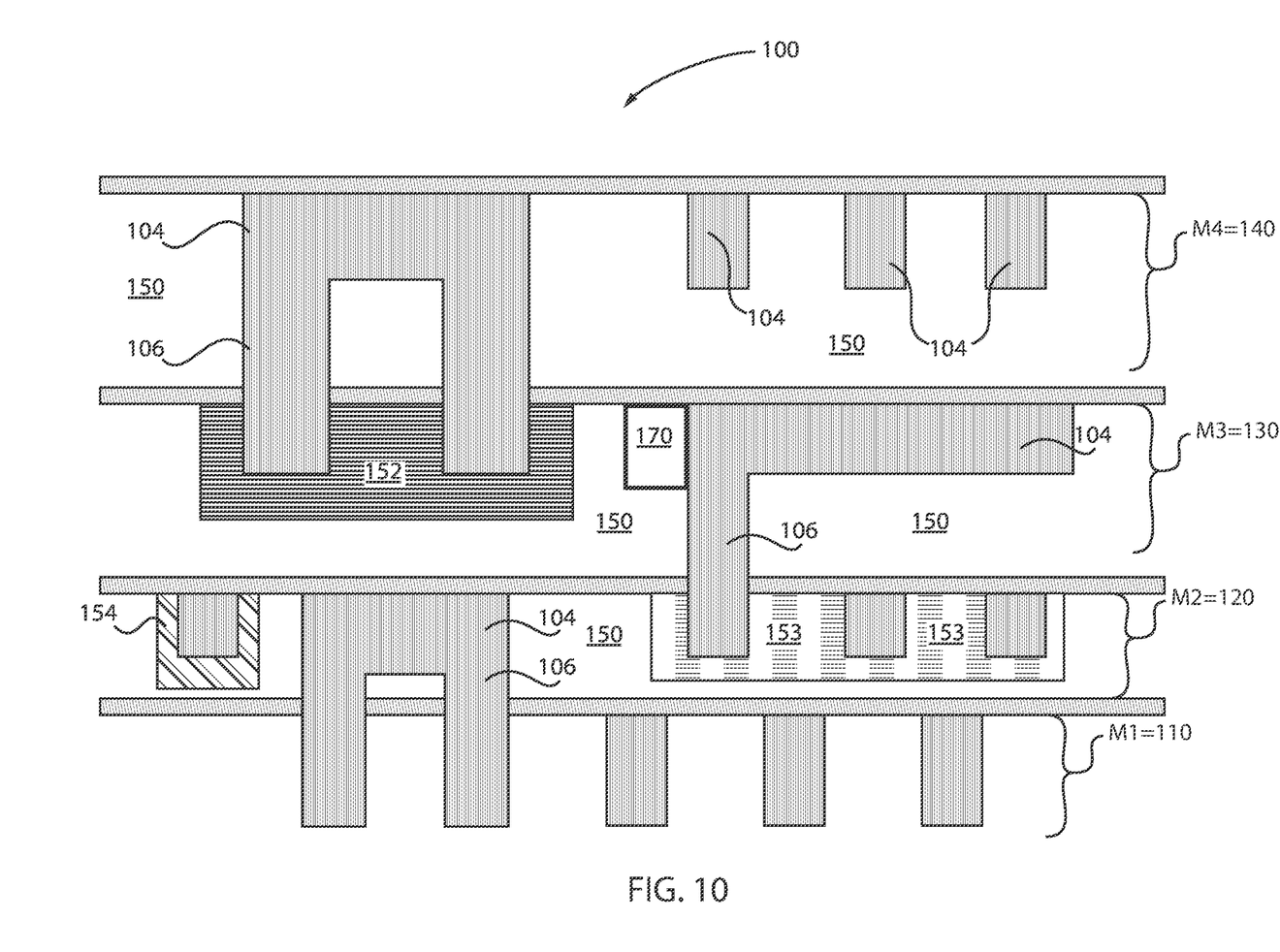
FIG. 10 is a cross-sectional view of a BEOL structure including two or more dielectrics in a common metal level, in accordance with an embodiment of the present invention.

FIG. 10 is a cross-sectional view of a BEOL structure including two or more dielectrics in a common metal level, in accordance with an embodiment of the present invention.

Integrated circuit (IC) chips are formed with BEOL metal levels. Each metal level can include metal wires (e.g., copper wires) that fill trenches with a layer of interlayer dielectric (ILD) material. These metal wires can function as interconnects, which provide electrical connections to on-chip devices (e.g., through vias and/or other metal wires) and/or to off-chip devices (e.g., through vias, other metal wires and/or input/output pins).

Structure 100 depicts the BEOL portion of IC fabrication where a single metal level can include two or more dielectrics.

The BEOL structure 100 can include a substrate, studs 104 connecting the substrate 102 to metal levels 110, 120, 130, 140. The metal levels 110, 120, 130, 140 can be linked to each other by vias 106. In particular, BEOL structure 100 depicts the M1 level (110), the M2 level (120), the M3 level (130), and the M4 level (140). The M3 level (130) can include a ULK layer 150, as well as a "bucket" including another ULK material 152. The ULK material 152 is different than the material used in the ULK layer 150. Moreover, the M2 level (120) can include a ULK layer 150, as well as "buckets" including ULK materials 153, 154. The ULK material 152 is different than the material used in the ULK layer 150 and different than the ULK materials 153, 154. Therefore, 3 different ULK materials can be employed in one metal level of a BEOL structure. Additionally, metal level M3 (130) can also include "buckets" 170.

Figure 11:
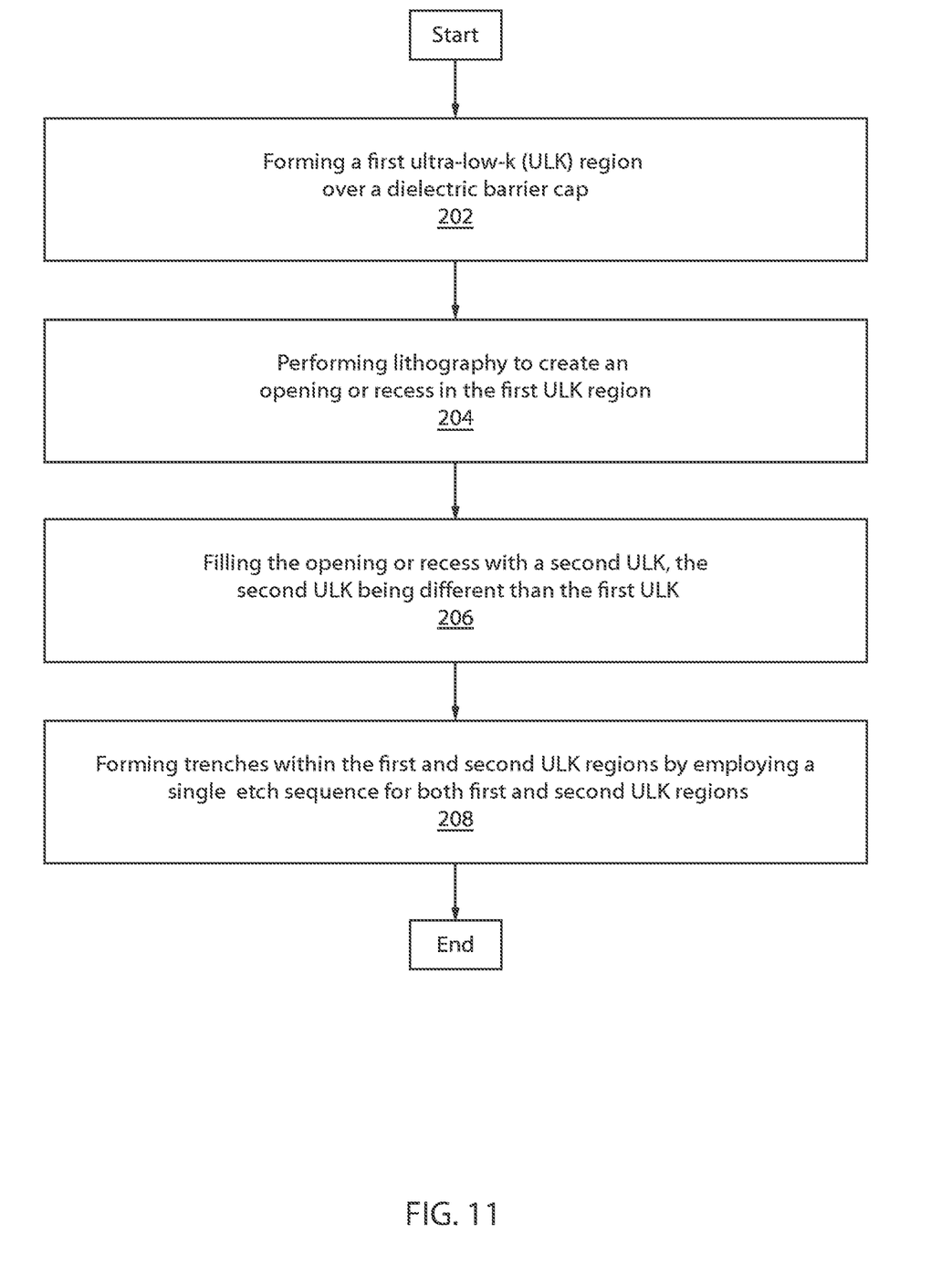
FIG. 11 is an exemplary method for forming two or more dielectrics in a common metal level of a BEOL structure, in accordance with an embodiment of the present invention.

FIG. 11 is an exemplary method for forming two or more dielectrics in a common metal level of a BEOL structure, in accordance with an embodiment of the present invention.

At block 202, a first ULK region is formed over a dielectric barrier cap.

At block 204, lithography is performed to create an opening or recess in the first ULK region.

At block 206, the opening or recess is filled with a second ULK, the second ULK being different than the first ULK.

At block 208, trenches are formed within the first and second ULK regions by employing a simultaneous etch sequence for both first and second ULK regions.

In summary, the exemplary embodiments of the present invention improve reactive ion etching (RIE) lag and improve resistance/capacitance (R/C) performance as a specific dielectric can be selected for a dedicated device element. RIE lag in IC etching is a frequently seen defect in semiconductor or microfabrication processes and appears in micro-electro-mechanical systems (MEMS) feature sizes up to hundreds of micrometers. RIE lag will affect the etching micro-uniformity and is much dependent on the pattern geometry. The effect is more severe as the feature width becomes smaller. RIE lag is caused by the depletion of etching ions and radicals or inhibiting neutrals during their trench passage. In general, the smaller feature size, the lower etching rate and the more obvious RIE lag. RIE lag is caused because narrower features etch slower than wider features. The photoresist grating structures prevent angularly dispersed ions from striking the feature bottom. This reduced ion flux at the feature bottom in high aspect ratio features causes the RIE lag. However, by employing two or more different dielectric materials within a metal level in a BEOL structure, RIE lag can be significantly reduced. Moreover, the RC is product can be minimized for maximum circuit speed.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for using two or more dielectrics in a common metal level in BEOL structures (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for reducing a resistance-capacitance product in a semiconductor device, the method comprising:
depositing a first ultra-low-k (ULK) material over a dielectric cap, the first ULK material defining a recess;
filling the recess with a second ULK material, the second ULK material being different than the first ULK material, where the first and second ULK materials are formed in a common metal level of a back-end-of-the-line (BEOL) structure;
forming first trenches within the first ULK material and second trenches within the second ULK material; and
filling the first and second trenches with a conductive material.

2. The method of claim 1, wherein the first trenches are etched at a first depth and the second trenches are etched at a second depth.

3. The method of claim 2, wherein the first depth is greater than the second depth.

4. The method of claim 2, wherein the first depth is less than the second depth.

5. The method of claim 1, wherein the first ULK material has a dielectric constant of less than 2.7 and the second ULK material has a dielectric constant of greater than 2.7.

6. The method of claim 1, wherein a third ULK material is formed within the first ULK material, the third ULK material being different than the first and second ULK materials.

7. The method of claim 1, wherein a simultaneous etch sequence is employed for both the first and second ULK materials.

8. A method for reducing a resistance-capacitance product in a semiconductor device, the method comprising:
depositing a first ultra-low-k (ULK) material over a dielectric cap, the first ULK material defining a recess;
depositing a dielectric liner over the first ULK material;
filling the recess including the dielectric liner with a second ULK material, the second ULK material being different than the first ULK material, where the first and second ULK materials are formed in a common metal level of a back-end-of-the-line (BEOL) structure;
forming first trenches within the first ULK material and second trenches within the second ULK material; and
filling the first and second trenches with a conductive material.

9. The method of claim 8, wherein the first trenches are etched at a first depth and the second trenches are etched at a second depth.

10. The method of claim 9, wherein the first depth is greater than the second depth.

11. The method of claim 9, wherein the first depth is less than the second depth.

12. The method of claim 8, wherein the first ULK material has a dielectric constant of less than 2.7 and the second ULK material has a dielectric constant of greater than 2.7.

13. The method of claim 8, wherein a third ULK material is formed within the first ULK material, the third ULK material being different than the first and second ULK materials.

14. The method of claim 8, wherein a simultaneous etch sequence is employed for both the first and second ULK materials.

15. A semiconductor structure for reducing a resistance-capacitance product, the semiconductor structure comprising:
a back-end-of-the-line (BEOL) structure including a plurality of metal levels;
a first ultra-low-k (ULK) material disposed over a dielectric cap;
a second ULK material positioned within a recess of the first ULK material, the second ULK material being different than the first ULK material, where the first and second ULK materials are disposed in a common metal level of the BEOL structure;
first trenches patterned within the first ULK material;
second trenches patterned within the second ULK material; and
a conductive material disposed within the first and second trenches.

16. The semiconductor structure of claim 15, wherein the first trenches are etched at a first depth and the second trenches are etched at a second depth.

17. The semiconductor structure of claim 16, wherein the first depth is greater than the second depth.

18. The semiconductor structure of claim 16, wherein the first depth is less than the second depth.

19. The semiconductor structure of claim 15, wherein the first ULK material has a dielectric constant of less than 2.7 and the second ULK material has a dielectric constant of greater than 2.7.

20. The semiconductor structure of claim 15, wherein a third ULK material is formed within the first ULK material, the third ULK material being different than the first and second ULK materials.

* * * * *